(12) United States Patent
Kim et al.

(10) Patent No.: US 8,705,275 B2
(45) Date of Patent: Apr. 22, 2014

(54) NON-VOLATILE MEMORY DEVICE AND METHOD FOR PROGRAMMING NON-VOLATILE MEMORY DEVICE

(75) Inventors: Hyun-Seok Kim, Goyang-Si (KR);
Sung-Bin Kim, Seoul (KR);
Sung-Hwan Bae, Seoul (KR);
Jong-Nam Baek, Hwaseong-Si (KR);
Sang-Hoon Lee, Yongin-Si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 42 days.

(21) Appl. No.: 13/599,022

(22) Filed: Aug. 30, 2012

(65) Prior Publication Data
US 2013/0128663 A1 May 23, 2013

(30) Foreign Application Priority Data
Nov. 21, 2011 (KR) ........................ 10-2011-0121810

(51) Int. Cl.
*G11C 16/04* (2006.01)
*G11C 16/06* (2006.01)

(52) U.S. Cl.
CPC ........ *G11C 16/04* (2013.01); *G11C 2211/5646* (2013.01)
USPC ............. 365/185.03; 365/185.02; 365/185.09

(58) Field of Classification Search
CPC ........................................................ G11C 16/04
USPC ..................................................... 365/185.03
See application file for complete search history.

(56) References Cited

U.S. PATENT DOCUMENTS

| 5,996,041 | A | * | 11/1999 | Kim ............................. 711/103 |
| 6,549,457 | B1 | | 4/2003 | Srinivasan et al. |
| 7,245,528 | B2 | * | 7/2007 | Shibata et al. .......... 365/185.03 |
| 7,505,318 | B2 | * | 3/2009 | Fukuda et al. ........... 365/185.09 |
| 7,672,162 | B2 | * | 3/2010 | Hwang .................... 365/185.03 |
| 7,782,667 | B2 | * | 8/2010 | Cha et al. ................ 365/185.03 |
| 8,089,804 | B2 | * | 1/2012 | Kim et al. ............... 365/185.02 |
| 2006/0002197 | A1 | | 1/2006 | Rudelic |
| 2012/0147669 | A1 | * | 6/2012 | Byeon ...................... 365/185.03 |
| 2012/0269010 | A1 | * | 10/2012 | Cho et al. ................ 365/189.07 |

FOREIGN PATENT DOCUMENTS

| JP | 09-297713 | 11/1997 |
| KR | 1020050069925 | 7/2005 |

* cited by examiner

*Primary Examiner* — Son Mai
(74) *Attorney, Agent, or Firm* — Volentine & Whitt, PLLC

(57) ABSTRACT

A method for programming a non-volatile memory device includes: providing a non-volatile memory device including data cells capable of storing N-bit data (N is a natural number) and a monitoring cell capable of monitoring whether the N-bit data has been programmed into the data cells; performing a first programming operation for the data cells while inhibiting programming of the monitoring cell; and performing a second programming operation for the monitoring cell while inhibiting programming of the data cells, wherein the second programming operation is performed differently from the first programming.

20 Claims, 13 Drawing Sheets

2nd BIT DATA PROGRAM (ISPP)

2nd BIT DATA PROGRAM (ONE-SHOT)

NON-VOLATILE MEMORY DEVICE AND METHOD FOR PROGRAMMING NON-VOLATILE MEMORY DEVICE

CROSS-REFERENCE TO RELATED APPLICATION

This application claims priority from Korean Patent Application No. 10-2011-0121810 filed on Nov. 21, 2011 in the Korean Intellectual Property Office, and all the benefits accruing therefrom under 35 U.S.C. 119, the contents of which in its entirety are herein incorporated by reference.

BACKGROUND

The present invention relates to a non-volatile memory device and a method for programming a non-volatile memory device.

Non-volatile memory devices are memory devices in which stored data is not lost even when the power supply is interrupted. Examples of non-volatile memory devices include programmable read-only memory (PROM), erasable PROM (EPROM), electrically EPROM (EEPROM), flash memory devices and the like. Among these devices, the flash memory devices may include various types of memory cells, and may be classified into a NAND type and a NOR type according to a cell array structure.

Meanwhile, while programming data to the memory cells of the non-volatile memory device, a sudden power off event may occur in the device wherein power that is being supplied to the device is suddenly withdrawn. If power off occurs during a programming operation, it is impossible to ensure the reliability of data programmed or stored into the memory cells. Accordingly, various methods are being developed to detect whether a sudden power off event has occurred while programming data into the memory cells.

SUMMARY

The present invention provides a non-volatile memory device and a method for programming a non-volatile memory device capable of detecting whether a sudden power off event has occurred while programming memory cells\.

The objects of the present invention are not limited thereto, and the other objects of the present invention will be described in or be apparent from the following description of the embodiments.

According to an aspect of the present invention, there is provided a method for programming a non-volatile memory device, comprising: providing a non-volatile memory device including data cells capable of storing N-bit data (N is a natural number) and at least one monitoring cell capable of monitoring whether the N-bit data has been programmed into the data cells; performing a first programming operation for the data cells while inhibiting programming of the monitoring cell; and performing a second programming operation for the monitoring cell while inhibiting programming of the data cells, wherein the second programming is performed differently from the first programming.

In one embodiment, the first programming operation uses an incremental step pulse program (ISPP) for programming the N-bit data into the data cells.

In one embodiment, the second programming operation applies a single program pulse one time to the monitoring cell.

In one embodiment, the non-volatile memory device includes M monitoring cells (M=N*K, K is a natural number).

In one embodiment, the non-volatile memory device includes M monitoring cells (M=N*K, K is a natural number).

In one embodiment, N is 2, and the 2-bit data includes LSB data and MSB data, and: performing the first programming operation to program the data cells includes programming the LSB data into the data cells while inhibiting programming of the 2K monitoring cells, and performing the second programming to program the monitoring cell includes programming a first set of K monitoring cells among the 2K monitoring cells while inhibiting programming of the data cells to which the LSB data has been programmed.

In one embodiment, programming of a second set of K monitoring cells among the 2K monitoring cells is inhibited while performing the second programming for programming the first set of K monitoring cells among the 2K monitoring cells.

In one embodiment, the method further comprises: programming the MSB data into the data cells while inhibiting programming of the 2K monitoring cells; and performing the second programming operation for a second set of K monitoring cells while inhibiting programming of the data cells to which the MSB data has been programmed and the first set of K monitoring cells.

In one embodiment, N is 3, and the 3-bit data includes LSB data, CSB data and MSB data, and: performing the first programming operation to program the data cells comprises programming the LSB data into the data cells while inhibiting programming of the 3K monitoring cells, and performing the second programming operation to program the monitoring cell includes programming a first set of K monitoring cells among the 3K monitoring cells while inhibiting programming of the data cells to which the LSB data has been programmed.

In one embodiment, programming of a second set of K monitoring cells and a third set of K monitoring cells among the 3K monitoring cells is inhibited while performing the second programming operation to program the first set of K monitoring cells among the 3K monitoring cells.

In one embodiment, the method further comprises reading the monitoring cell using a monitoring voltage to detect whether a sudden power off event has occurred while performing the first programming operation for programming the N-bit data into the data cells.

In one embodiment, the monitoring voltage is larger than a maximum value of a threshold voltage of the monitoring cell that can be changed by disturbance irrelevant to the second programming operation.

In one embodiment, the non-volatile memory device includes a plurality of monitoring cells, and reading the monitoring cells using a monitoring voltage to detect whether the sudden power off event has occurred while performing the first programming operation for programming the data cells comprises reading the monitoring cells using the monitoring voltage, and if a threshold voltage of at least one of the monitoring cells is greater than or equal to than the monitoring voltage, determining that the sudden power off has not occurred during the first programming of the data cells.

In one embodiment, the data cells and the monitoring cell share a word line.

According to another aspect of the present invention, there is provided a method for programming a non-volatile memory device, comprising: providing a non-volatile memory device including data cells capable of storing 3-bit data including first to third bit data and 3K (K is a natural number) monitoring cells capable of monitoring whether the 3-bit data has been programmed to the data cells; programming the first bit data multiple times to the data cells while inhibiting the 3K monitoring cells; programming the first bit data once to K monitoring cells among the 3K monitoring cells while inhibiting the data cells to which the first bit data has been programmed and the other 2K monitoring cells; programming the second bit data multiple times to the data cells while inhibiting the 3K monitoring cells; programming the second bit data once to K monitoring cells while inhibiting the data cells to which the second bit data has been programmed, K monitoring cells to which the first bit data has been programmed, and the other K monitoring cells to which the first bit data has not been programmed.

In one embodiment, the method further comprises: programming the third bit data multiple times to the data cells while inhibiting programming of the 3K monitoring cells; and programming the third bit data once to the third set of K monitoring cells while inhibiting programming of the data cells to which the third bit data has been programmed, and also inhibiting programming of the other 2K first and second sets of K monitoring cells According to still another aspect of the invention, a non-volatile memory device is provided, comprising: a word line; a plurality of bit lines; a set of data cells connected to the word line, each of the data cells further being connected to a corresponding one of the bit lines and each configured to store at least a first data bit; and a monitoring cell connected to the word line and to a corresponding one of the bit lines, wherein the monitoring cell has a threshold voltage and is configured for the threshold voltage to have a first value whenever each of the set of data cells is programmed to store the first data bit without a power off event occurring while programming the first data into the set of data cells, and wherein the monitoring cell is configured for the threshold voltage to have a second value different from the first value whenever the power off event occurred while programming the first data bit into the set of data cells.

In one embodiment, programming of the monitoring cell is inhibited while programming the first data bits into the set of data cells.

In one embodiment, programming of the set of data cells is inhibited while programming the threshold voltage of the monitoring cell.

In one embodiment, the non-volatile memory device of claim 15, wherein each of the set of data cells is further configured to store at least a second data bit, the non-volatile memory device further comprising a second monitoring cell connected to the word line, wherein the second monitoring cell has a threshold voltage and is configured for the threshold voltage to have a third value whenever each of the set of data cells is programmed to store the second data bit without a power off event occurring while programming the second data into the set of data cells, and wherein the second monitoring cell is configured for the threshold voltage to have a fourth value different from the third value whenever the power off event occurred while programming the second data bit into the set of data cells.

In one embodiment, the non-volatile memory device of claim 19, wherein programming of the monitoring cell and the second monitoring cell is inhibited while programming while programming the first data bits into the set of data cells, and also while programming the second data bits into the set of data cells.

The above and other features and advantages of the present invention will become more apparent by describing in detail exemplary embodiments thereof with reference to the attached drawings in which:

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Hereinafter, a method for programming a non-volatile memory device in accordance with an embodiment of the present invention will be described with reference to FIGS. 1 to 4.

Figure 1:
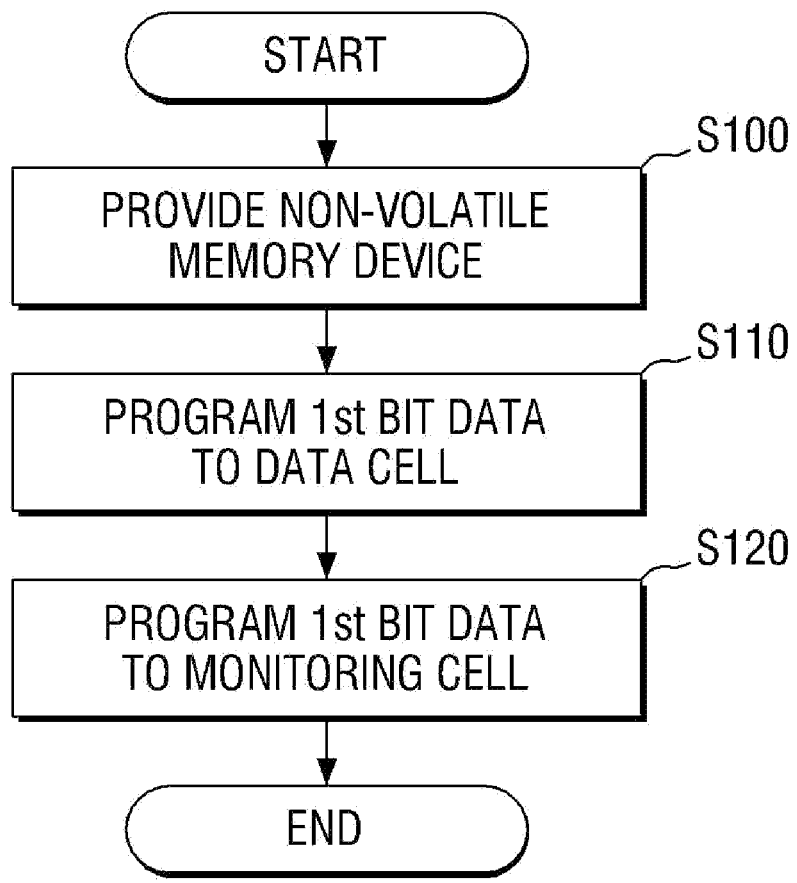
FIG. 1 is a flowchart showing a method for programming a non-volatile memory device in accordance with an embodiment of the present invention.
Figure 2:
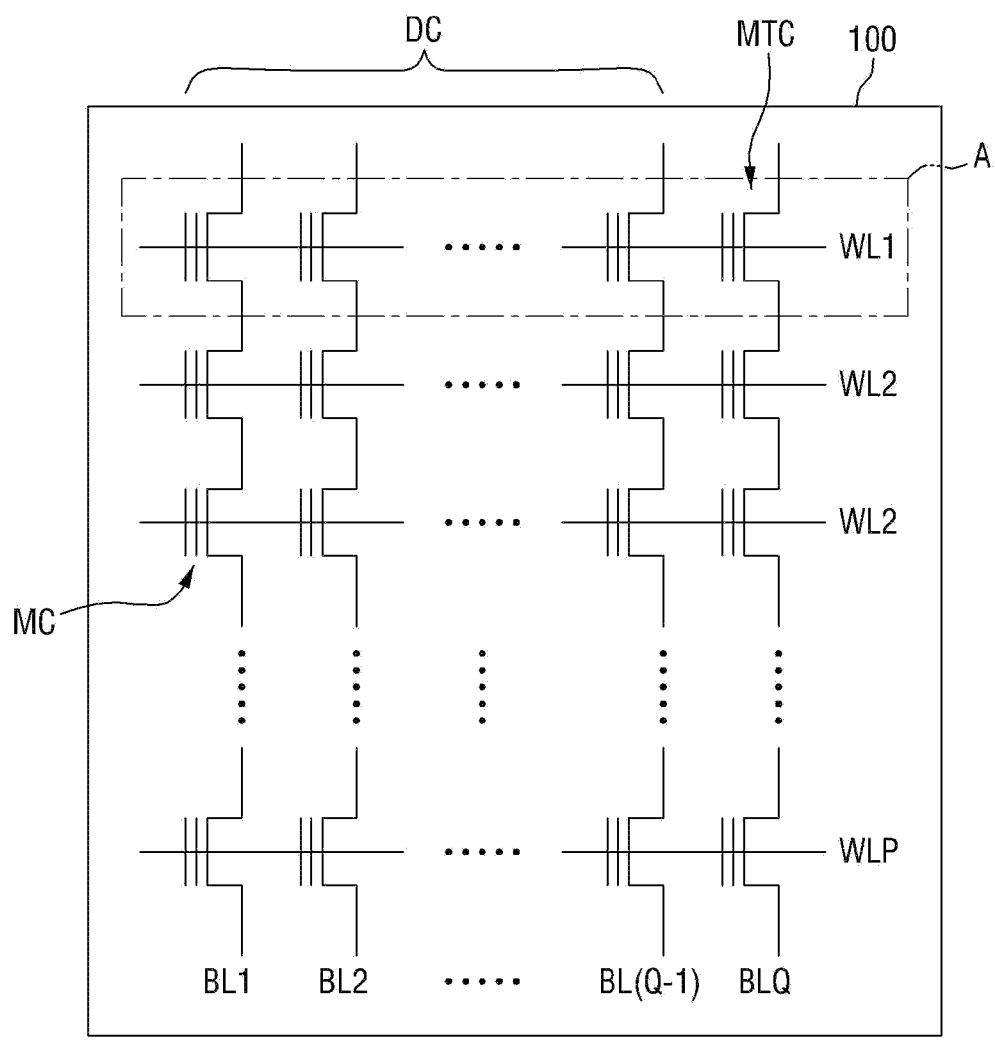
FIGS. 2 to 4 are diagrams for explaining the method for programming a non-volatile memory device in accordance with the embodiment of the present invention.
Figure 3:
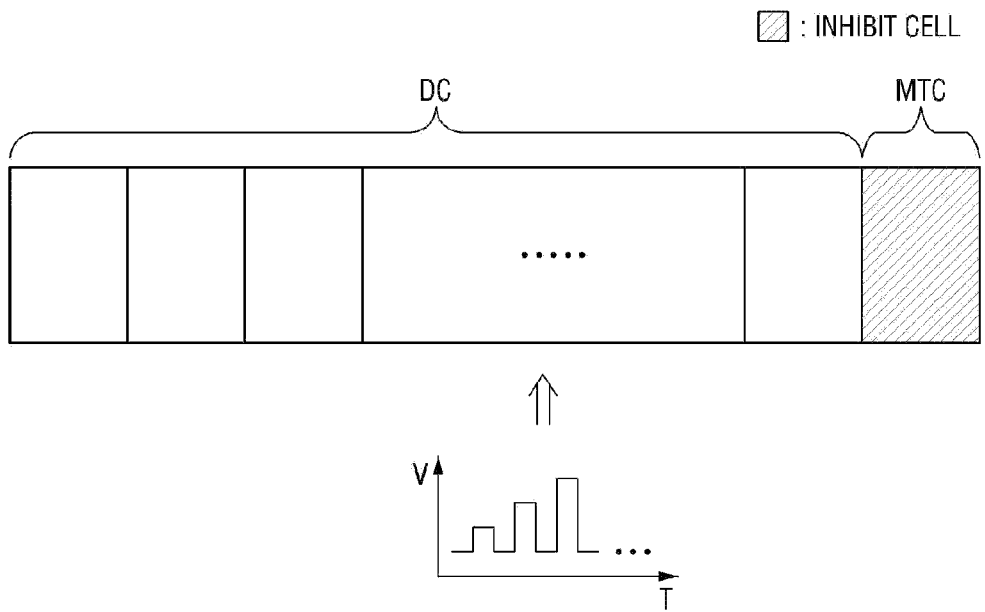
Figure 4:
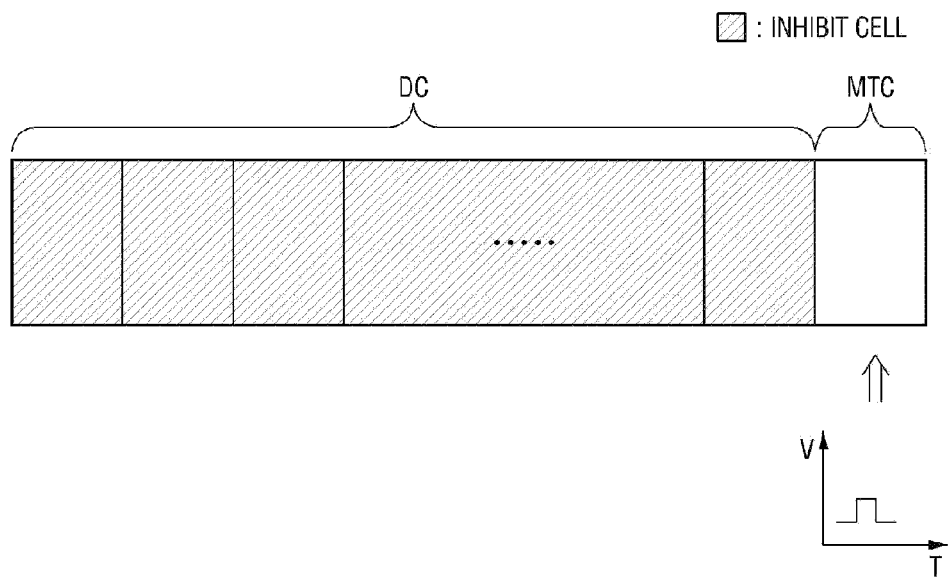

FIG. 1 is a flowchart showing a method for programming a non-volatile memory device in accordance with an embodiment of the present invention. FIGS. 2 to 4 are diagrams for explaining the method for programming a non-volatile memory device in accordance with the embodiment of the present invention.

First, referring to FIG. 1, a non-volatile memory device is provided (step S100). Specifically, a non-volatile memory device may be provided which includes data cells capable of storing N-bit data (N is a natural number), and monitoring cells capable of monitoring whether the N-bit data has been programmed into the data cells. A detailed description thereof will be made below with reference to FIG. 2.

Referring to FIG. 2, the non-volatile memory device may include a memory cell array 100. Memory cell array 100 may include a plurality of word lines WL1 to WLP extending in a first direction (e.g., horizontal direction) and a plurality of bit lines BL1 to BLQ extending in a second direction (e.g., vertical direction).

Memory cells MC are defined at intersections between the word lines WL1 to WLP and the bit lines BL1 to BLQ. In this embodiment, the memory cells MC may store N-bit data (N is a natural number).

Meanwhile, among the memory cells MC sharing the word lines WL1 to WLP, some of the memory cells may be defined as data cells DC capable of storing N-bit data (N is a natural number) and the other memory cells may be defined as monitoring cells MTC capable of monitoring whether the N-bit data has been programmed into the data cells DC. In other words, the data cells DC and the monitoring cells MTC may share the word lines WL1 to WLP.

In this embodiment, for convenience of explanation, it is assumed that a plurality of data cells DC each storing 1-bit data and one monitoring cell MTC share one of the word lines WL1 to WLP. Further, although memory cell array 100 of a NAND-type flash memory is exemplarily illustrated in FIG. 1, the present invention is not limited to that shown in FIG. 1. The non-volatile memory device of this embodiment may be a NOR-type flash memory, phase change memory, or resistive memory unlike that shown in FIG. 1.

Referring again to FIG. 1, the data cells are first programmed (step S110). Specifically, the data cells are first programmed while inhibiting the monitoring cell. A detailed description thereof will be made below with reference to FIG. 3.

FIG. 3 is a conceptual block diagram showing region A of FIG. 2. FIG. 3 shows, as described above, a plurality of data cells each storing 1-bit data, a monitoring cell MTC. The monitoring cell MTC may be one memory cell MC sharing a word line WL1 with the plurality of data cells DC.

Inhibiting the monitoring cell MTC means inhibiting 1-bit data from being programmed into the monitoring cell MTC although 1-bit data is programmed into the adjacent data cells DC by applying a specific voltage to the word line (e.g., WL1) and the bit line (e.g., BLQ) connected to the monitoring cell MTC. Accordingly, in case of programming 1-bit data to the data cells DC while inhibiting the monitoring cell MTC, 1-bit data is programmed into the data cells DC, whereas 1-bit data is not programmed into the monitoring cell MTC.

For example, let us suppose that three data cells DC and one monitoring cell MTC share a word line. Further, let us suppose that '110' is stored in the three data cells DC and '1' is stored in the monitoring cell MTC. In this case, when all of the three data cells DC are programmed to '0' (more specifically, the first and second data cells DC among the three data cells DC are programmed to '0') while inhibiting the monitoring cell MTC, '000' is stored in the three data cells DC, whereas '1' is still stored in the monitoring cell MTC because the monitoring cell MTC is inhibited during programming of the data cells DC.

In this case, e.g., an incremental step pulse program (ISPP) may be used to program 1-bit data into a plurality of data cells DC (more specifically, programming the data cells DC storing '1' to instead store '0'). That is, as shown in FIG. 3, program pulses with gradually increasing magnitudes may be applied multiple times to the data cells DC, thereby programming 1-bit data into the data cells DC.

Then, referring again to FIG. 1, the monitoring cell is second programmed (step S120). Specifically, the monitoring cell is second programmed while inhibiting the data cells, and the second programming operation is performed differently from how the first programming operation is performed. A detailed description thereof will be made below with reference to FIG. 4.

Referring to FIG. 4, 1-bit data is programmed into the monitoring cell MTC (more specifically, a '1' stored in the monitoring cell MTC is programmed to instead be '0') while inhibiting the data cells DC. In this case, programming 1-bit data to the monitoring cell MTC and programming 1-bit data to the data cells DC differ in the number of program pulses which are applied in the programming operation. That is, program pulses with gradually increasing magnitudes are applied multiple times to the data cells DC when programming 1-bit data to the data cells DC, whereas a program pulse is applied only once to the monitoring cell MTC when programming 1-bit data to the monitoring cell MTC.

After the non-volatile memory device is programmed by this method, if the monitoring cell MTC is read using a monitoring voltage having a predetermined voltage level, it can be detected whether a sudden power off event has occurred during programming of the data cells DC. In other words, it can be detected whether the data cells DC are normally programmed without a sudden power off event during their programming.

An explanation for thus is as follows. If a sudden power off event has occurred during programming of the data cells DC, 1-bit data is not programmed into the monitoring cell MTC which is supposed to be programmed afterwards. Accordingly, when the monitoring cell MTC is read using a monitoring voltage, it is detected that the monitoring cell MTC has not been programmed. However, if a sudden power off event has not occurred during programming of the data cells DC, 1-bit data is normally programmed into the monitoring cell MTC which is supposed to be programmed afterwards. Accordingly, if the monitoring cell MTC is read using a monitoring voltage, it is detected that the monitoring cell MTC has been programmed.

In brief, after completing the above-described programming operation, when the monitoring cell MTC is read using a monitoring voltage, if it is detected that the monitoring cell MTC has been normally programmed, then it may be determined or ascertained that a sudden power off event has not occurred during programming of the data cells DC. Accordingly, it may be determined or ascertained that data has been normally programmed into the data cells DC sharing the word line with the monitoring cell MTC.

However, when the monitoring cell MTC is read using a monitoring voltage, if it is detected that the monitoring cell MTC has not been normally programmed, then it may be determined or ascertained that a sudden power off event has occurred during programming of the data cells DC. Accordingly, in this case, additional measures (e.g., data recovery) are required for the data of the data cells DC sharing the word line with the monitoring cell MTC.

A more specific example will be described below.

For example, let us suppose that 1-bit data of '1' (data indicating that the monitoring cell MTC is in an erased state) is stored in the monitoring cell MTC in an initial stage. If there is no sudden power off event during the programming operation, the monitoring cell MTC is programmed to '0' after programming all of the data cells DC. Accordingly, when the monitoring cell MTC is read using a monitoring voltage afterwards, it is detected that '0' is stored in the monitoring cell MTC. Thus, it may be determined or ascertained that 1-bit data has been normally programmed into the data cells DC sharing the word line with the monitoring cell MTC.

However, on the other hand, if there is a sudden power off event during the programming operation, the programming operation is interrupted during programming of the data cells DC. Accordingly, the monitoring cell MTC which is supposed to be programmed afterwards is not programmed. That is, in this case, '1' is still stored in the monitoring cell MTC. When the monitoring cell MTC is read using a monitoring voltage afterwards, it is detected that '1' is stored in the monitoring cell MTC. Since 1-bit data stored in the data cells DC sharing the word line with the monitoring cell MTC is unreliable data, additional measures (e.g., data recovery) are performed.

Meanwhile, in this embodiment, when 1-bit data is programmed into the data cells DC, program pulses with different magnitudes are multiple times applied to the data cells DC. However, when 1-bit data is programmed into the monitoring cell MTC, one program pulse is once applied to the monitoring cell MTC. That is, it takes a little extra time to program the monitoring cell MTC. Accordingly, in the programming method of this embodiment, although the monitoring cell MTC is additionally programmed, it does not have a significant impact on the overall performance of the non-volatile memory device. Namely, it is possible to detect whether a sudden power event off has occurred during programming of the data cells DC while minimizing the impact on the performance of the non-volatile memory device.

Next, a method for programming a non-volatile memory device in accordance with another embodiment of the present invention will be described with reference to FIGS. 5 to 10.

Figure 5:
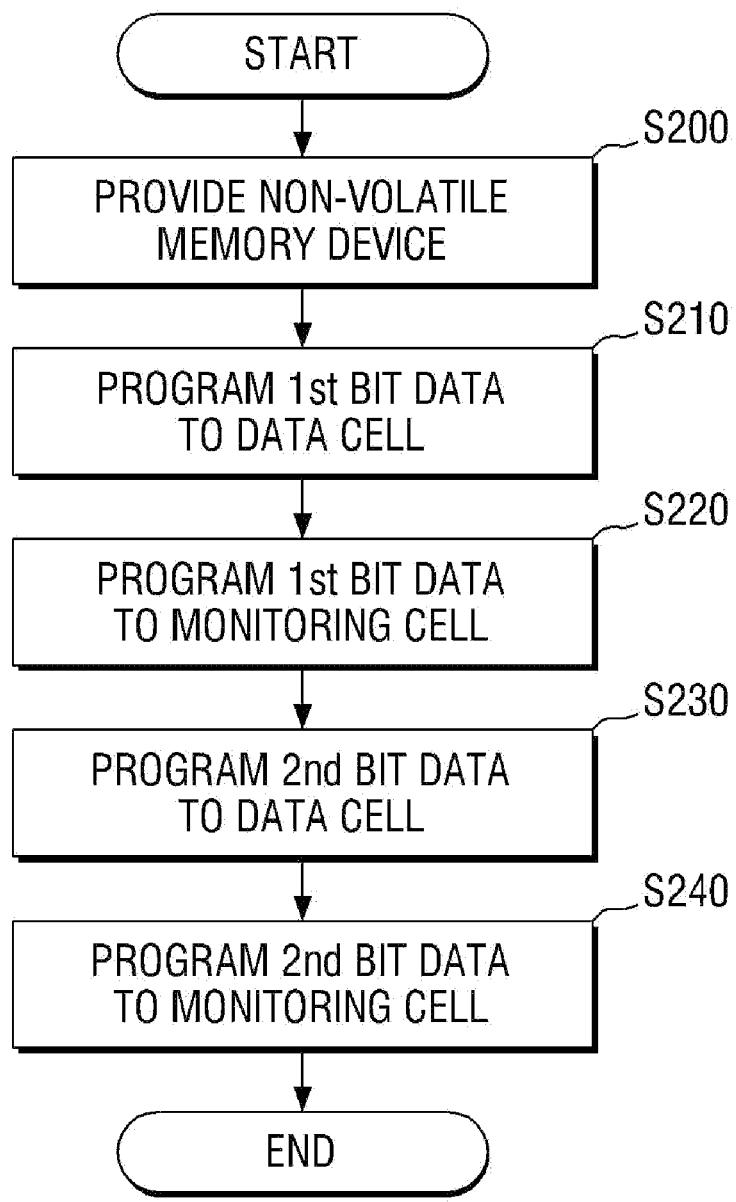
FIG. 5 is a flowchart showing a method for programming a non-volatile memory device in accordance with another embodiment of the present invention.

FIG. 5 is a flowchart showing a method for programming a non-volatile memory device in accordance with another embodiment of the present invention. FIGS. 6 to 10 are diagrams for explaining the method for programming a non-volatile memory device in accordance with another embodiment of the present invention.

First, referring to FIG. 5, a non-volatile memory device is provided (step S200).

In this case, a basic configuration of memory cell array 100 of the non-volatile memory device of this embodiment is to the same as that shown in FIG. 2. However, in the non-volatile memory device of this embodiment, it is assumed that each of data cells DC and monitoring cells MTC1 and MTC2 may store 2-bit data. In this case, 2-bit data may include first bit data and second bit data. The first bit data may be, e.g., LSB bit data, and the second bit data may be, e.g., MSB bit data.

Further, although there is one monitoring cell MTC sharing the word line with the data cells DC in the above embodiment, a case where there are a plurality of monitoring cells MTC1 and MTC2 will be described as an example in this embodiment. Specifically, the number of monitoring cells MTC1 and MTC2 sharing the word line with the data cells DC may be 2K (K is a natural number). Among them, K monitoring cells MTC1 are cells for monitoring whether there has been a sudden power off event while programming LSB bit data into the data cells DC, and the other K monitoring cells MTC2 are cells for monitoring whether there has been a sudden power off event while programming MSB bit data into the data cells DC.

Figure 6:
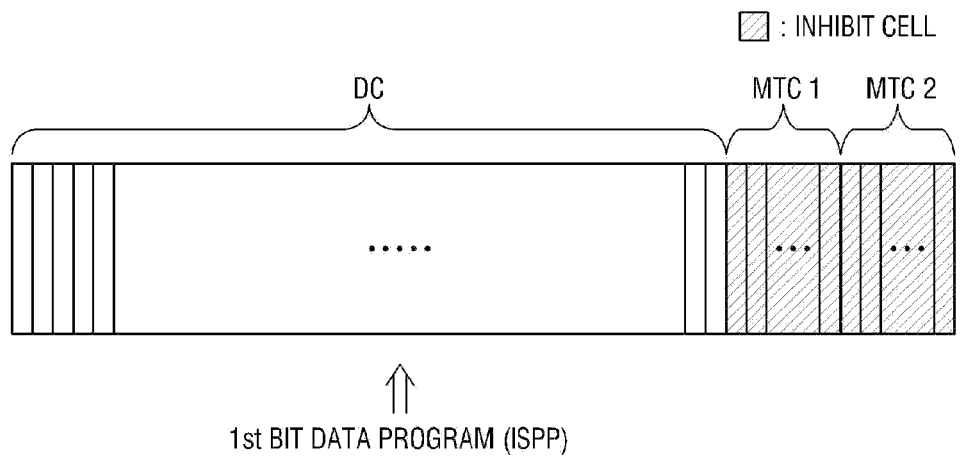
FIGS. 6 to 10 are diagrams for explaining the method for programming a non-volatile memory device in accordance with another embodiment of the present invention

Then, referring to FIGS. 5 and 6, LSB bit data is programmed into the data cells DC (step S210). Specifically, LSB bit data is programmed into the data cells DC while inhibiting 2K monitoring cells MTC1 and MTC2. In this case, e.g., an incremental step pulse program (ISPP) may be used to program LSB bit data into a plurality of the data cells DC.

Figure 7:
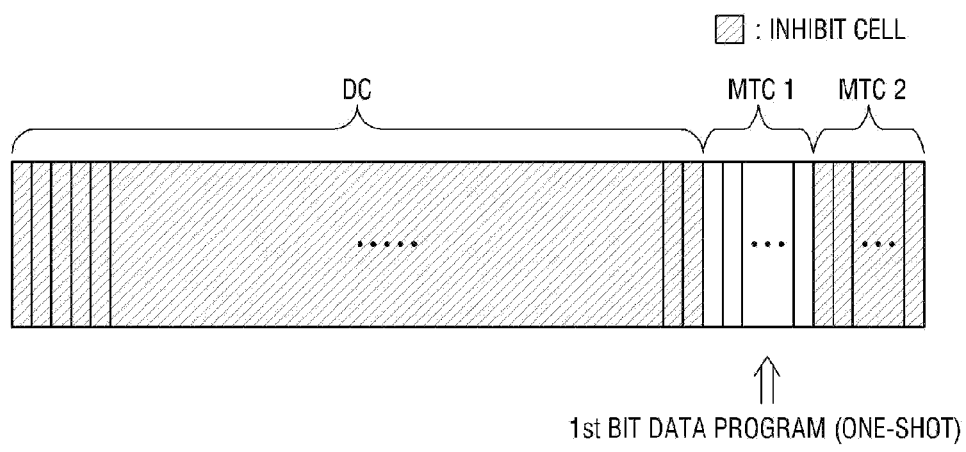

Then, referring to FIGS. 5 and 7, LSB bit data is programmed into K monitoring cells MTC1 (step S220). Specifically, LSB bit data is programmed into K monitoring cells MTC1 while inhibiting the data cells DC and the other K monitoring cells MTC2 to which LSB bit data has not been programmed. In other words, while LSB bit data is programmed into K monitoring cells MTC1, the data cells DC to which LSB bit data has been programmed and the other K monitoring cells MTC2 may be maintained in an inhibited state.

Meanwhile, in this case, programming LSB bit data into K monitoring cells MTC1 may be, as described above, applying one program pulse for programming LSB bit data once to K monitoring cells MTC1.

Figure 8:
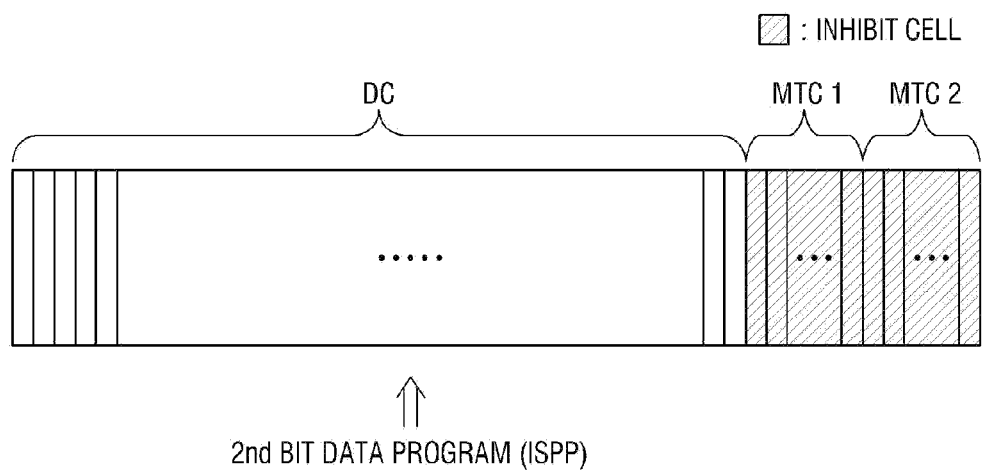

Then, referring to FIGS. 5 and 8, MSB bit data is programmed into the data cells DC (step S230). Specifically, MSB bit data is programmed into the data cells DC while inhibiting 2K monitoring cells MTC1 and MTC2. Also in this case, e.g., an incremental step pulse program (ISPP) may be used to program MSB bit data into a plurality of the data cells DC.

Figure 9:
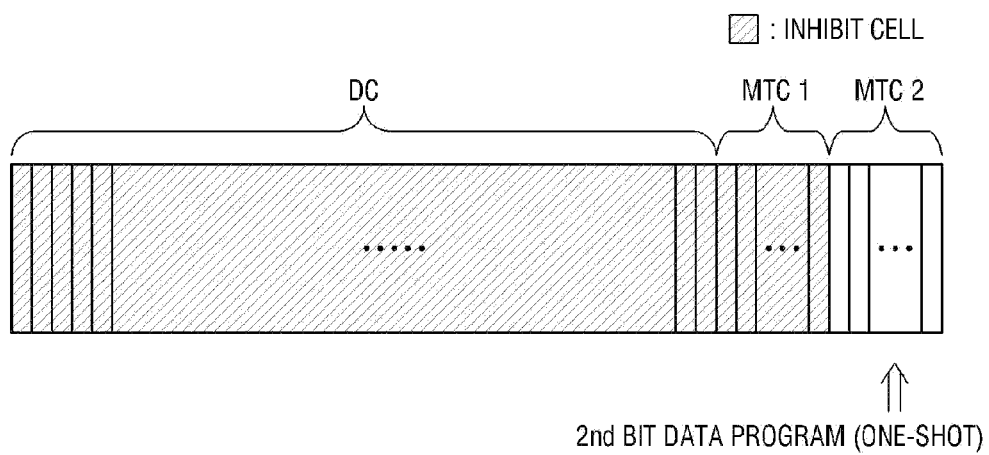

Then, referring to FIGS. 5 and 9, MSB bit data is programmed into K monitoring cells MTC2 (step S240). Specifically, MSB bit data is programmed into K monitoring cells MTC2 while inhibiting the data cells DC and the other K monitoring cells MTC1 to which MSB bit data has not been programmed. In other words, while MSB bit data is programmed into K monitoring cells MTC2, the data cells DC to which MSB bit data has been programmed and the other K monitoring cells MTC1 may be maintained in an inhibited state.

Also in this case, programming MSB bit data into K monitoring cells MTC2 may be applying one program pulse for programming MSB bit data once to K monitoring cells MTC2.

After the non-volatile memory device is programmed by this method, if the monitoring cells MTC1 and MTC2 are read using a monitoring voltage having a predetermined voltage level, it can be detected whether a sudden power off event has occurred during programming of the data cells DC. Particularly, in this embodiment, it can be also detected whether a sudden power off event has occurred while programming LSB bit data into the data cells DC, or a sudden power off event has occurred while programming MSB bit data into the data cells DC.

In this regard, a more specific description will be given below.

After completing the above-described programming operation, first, K monitoring cells MTC1 are read using a monitoring voltage. In this case, a voltage level of the monitoring voltage may be determined in consideration of disturbance characteristics of the monitoring cells MTC1.

Figure 10:
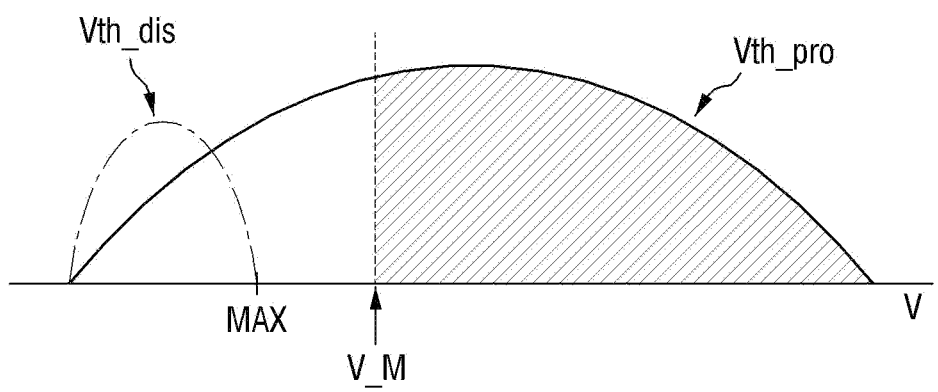

Referring to FIG. 10, a first curve Vth_dis represents distribution of a threshold voltage that can be changed by the disturbance in a state where LSB bit data is not programmed into K monitoring cells MTC1. Further, a second curve Vth_pro represents distribution of a threshold voltage in a state where LSB bit data is programmed into K monitoring cells MTC1 by applying a program pulse once to K monitoring cells MTC1. Referring to FIG. 10, in this embodiment, since a program pulse is applied once to K monitoring cells MTC1, a threshold voltage distribution curve Vth_pro caused by programming may be formed widely as illustrated.

In this case, a monitoring voltage V_M for reading K monitoring cells MTC1 is larger than a maximum value MAX of a threshold voltage that can be changed by the disturbance of K monitoring cells MTC1. Further, if it is detected that even one among K monitoring cells MTC1 has been programmed (i.e., if there is a hatched area of FIG. 10), it is determined or ascertained that LSB bit data has been programmed into the data cells DC sharing the word line with K monitoring cells MTC1 without a sudden power off event. Further, this process is applied in the same way to the other K monitoring cells MTC2.

In brief, in this embodiment, it can be detected as follows whether the data cells DC sharing the word line with 2K monitoring cells MTC1 and MTC2 have been normally programmed.

First, after completing the above-described programming operation, K monitoring cells MTC1 are read using a monitoring voltage V_M. As a result, if it is detected that even one among K monitoring cells MTC1 has been normally programmed, it may be determined or ascertained that LSB bit data has been normally programmed into the data cells DC.

Then, the other K monitoring cells MTC2 are read using the same monitoring voltage V_M. As a result, similarly, if it is detected that even one among the other K monitoring cells MTC2 has been normally programmed, it may be determined or ascertained that MSB bit data has been normally programmed into the data cells DC.

On the other hand, if the threshold voltage of all K monitoring cells MTC1 is less than or equal to the monitoring voltage V_M, it may be determined or ascertained that LSB bit data has not been normally programmed into the data cells DC due to a sudden power off event or the like. Further, similarly, if the threshold voltage of all the other K monitoring cells MTC2 is less than or equal to the monitoring voltage V_M, it may be determined or ascertained that MSB bit data has not been normally programmed into the data cells DC due to a sudden power off event or the like.

Next, a method for programming a non-volatile memory device in accordance with still another embodiment of the present invention will be described with reference to FIGS. 11 to 17.

Figure 11:
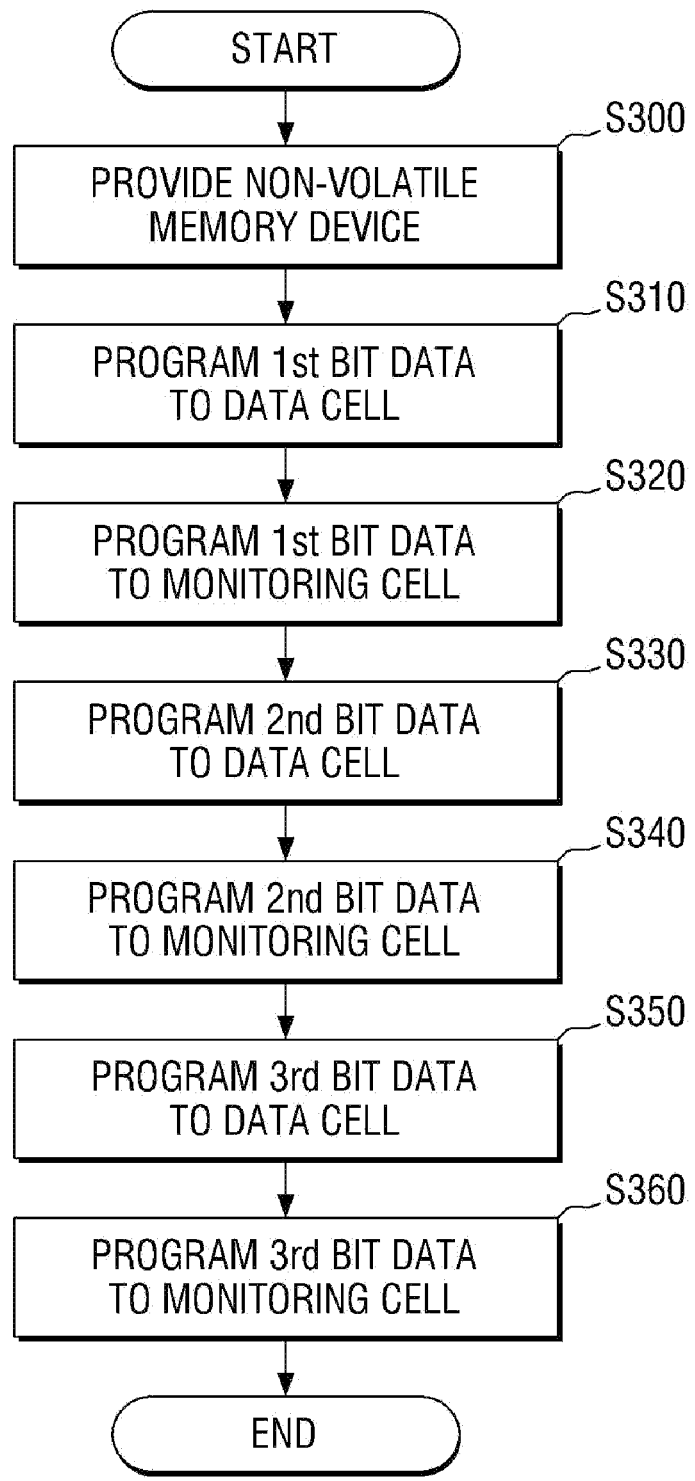
FIG. 11 is a flowchart showing a method for programming a non-volatile memory device in accordance with still another embodiment of the present invention.

FIG. 11 is a flowchart showing a method for programming a non-volatile memory device in accordance with still another embodiment of the present invention. FIGS. 12 to 17 are diagrams for explaining the method for programming a non-volatile memory device in accordance with still another embodiment of the present invention.

First, referring to FIG. 11, a non-volatile memory device is provided (step S300).

In this case, a basic configuration of memory cell array 100 of the non-volatile memory device of this embodiment is equal to that shown in FIG. 2. However, in the non-volatile memory device of this embodiment, it is assumed that each of data cells DC and monitoring cells MTC3, MTC4 and MTC5 may store 3-bit data. In this case, 3-bit data may include first to third bit data. The first bit data may be, e.g., LSB bit data, the second bit data may be, e.g., CSB bit data, and the third bit data may be, e.g., MSB bit data.

Further, a case where the number of monitoring cells MTC3, MTC4 and MTC5 sharing the word line with the data cells DC may be 3K (K is a natural number) will be described as an example in this embodiment. In this case, K monitoring cells MTC3 are cells for monitoring whether there has been a sudden power off event while programming LSB bit data into the data cells DC, and K monitoring cells MTC4 are cells for monitoring whether there has been a sudden power off event while programming CSB bit data into the data cells DC. Further, the other K monitoring cells MTC5 are cells for monitoring whether there has been a sudden power off event while programming MSB bit data into the data cells DC.

Figure 12:
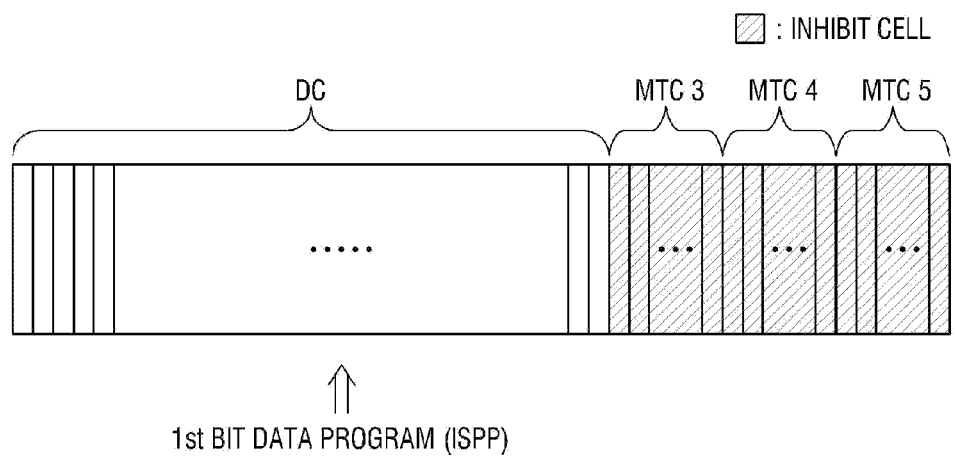
FIGS. 12 to 17 are diagrams for explaining the method for programming a non-volatile memory device in accordance with still another embodiment of the present invention.

Then, referring to FIGS. 11 and 12, LSB bit data is programmed into the data cells DC (step S310). Specifically, LSB bit data is programmed into the data cells DC while inhibiting 3K monitoring cells MTC3, MTC4 and MTC5. In this case, e.g., an incremental step pulse program (ISPP) may be used to program LSB bit data into a plurality of the data cells DC.

Figure 13:
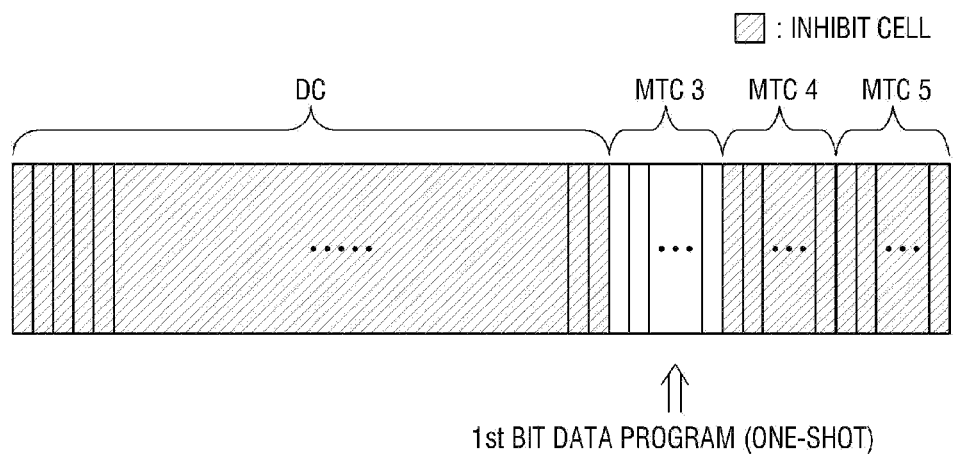

Then, referring to FIGS. 11 and 13, LSB bit data is programmed into K monitoring cells MTC3 (step S320). Specifically, LSB bit data is programmed into K monitoring cells MTC3 while inhibiting the data cells DC and the other 2K monitoring cells MTC4 and MTC5 to which LSB bit data has not been programmed. In other words, while LSB bit data is programmed into K monitoring cells MTC3, the data cells DC to which LSB bit data has been programmed and the other 2K monitoring cells MTC4 and MTC5 may be maintained in an inhibited state. In this case, programming LSB bit data into K monitoring cells MTC3 may be, as described above, applying one program pulse for programming LSB bit data once into K monitoring cells MTC3.

Figure 14:
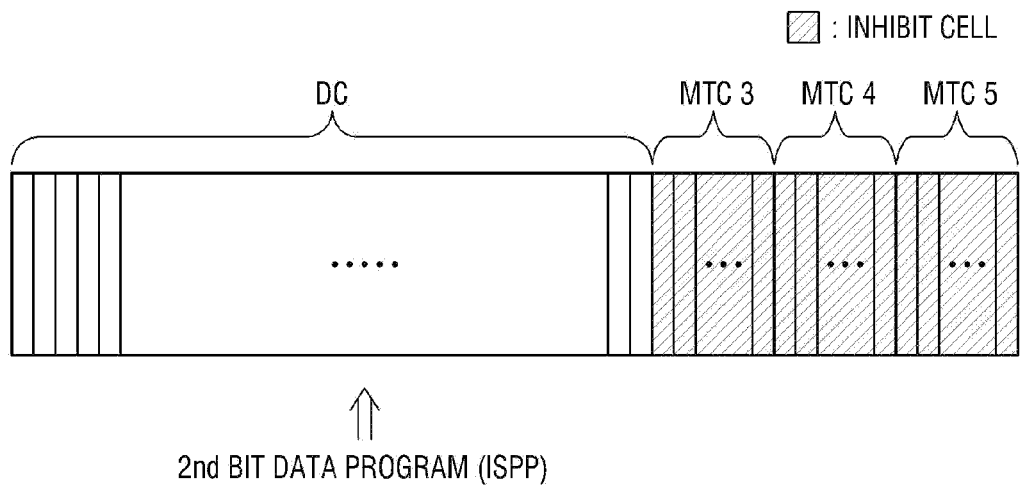

Then, referring to FIGS. 11 and 14, CSB bit data is programmed into the data cells DC (step S330). Specifically, CSB bit data is programmed into the data cells DC while inhibiting 3K monitoring cells MTC3, MTC4 and MTC5. In this case, e.g., an incremental step pulse program (ISPP) may be used to program CSB bit data into a plurality of the data cells DC.

Figure 15:
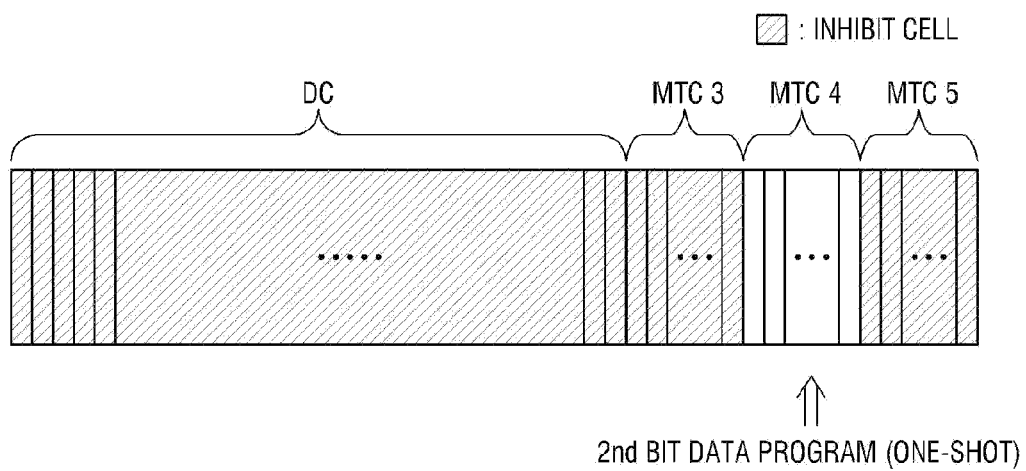

Then, referring to FIGS. 11 and 15, CSB bit data is programmed into K monitoring cells MTC4 (step S340). Specifically, CSB bit data is programmed into K monitoring cells MTC4 while inhibiting the data cells DC and 2K monitoring cells MTC3 and MTC5. In this case, programming CSB bit data into K monitoring cells MTC4 may be, as described above, applying one program pulse for programming CSB bit data once into K monitoring cells MTC4.

Figure 16:
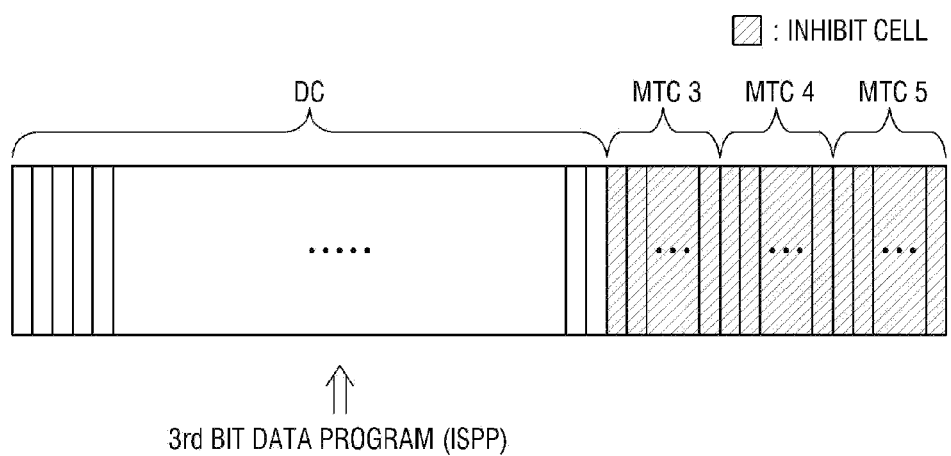

Then, referring to FIGS. 11 and 16, MSB bit data is programmed into the data cells DC (step S350). Specifically, MSB bit data is programmed into the data cells DC while inhibiting 3K monitoring cells MTC3, MTC4 and MTC5. In this case, e.g., an incremental step pulse program (ISPP) may be used to program MSB bit data into a plurality of the data cells DC.

Figure 17:
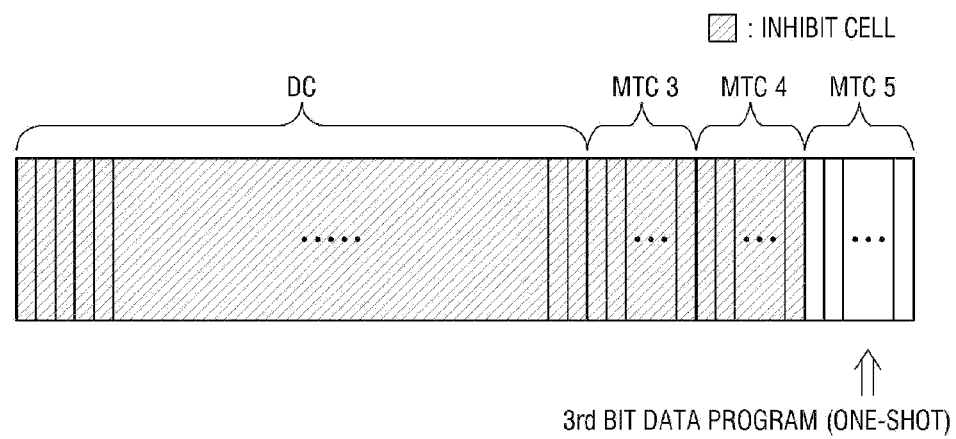

Then, referring to FIGS. 11 and 17, MSB bit data is programmed into K monitoring cells MTC5 (step S360). Specifically, MSB bit data is programmed into K monitoring cells MTC5 while inhibiting the data cells DC and 2K monitoring cells MTC3 and MTC4. In this case, programming MSB bit data into K monitoring cells MTC5 may be, as described above, applying one program pulse for programming MSB bit data once into K monitoring cells MTC5.

After the non-volatile memory device is programmed by this method, if the monitoring cells MTC3, MTC4 and MTC5 are read using a monitoring voltage having a predetermined voltage level, it can be detected whether a sudden power off event has occurred during programming of the data cells DC. Particularly, in this embodiment, it can be detected whether a sudden power off event has occurred while programming LSB bit data into the data cells DC, whether a sudden power off event has occurred while programming CSB bit data into the data cells DC, or whether a sudden power off event has occurred while programming MSB bit data into the data cells DC. Since a detailed description thereof has been made above, a repeated description is omitted.

Cases where 1-bit data, 2-bit data and 3-bit data can be stored in each of the data cells DC and the monitoring cells MTC respectively have been described above, but the present invention is not limited thereto. Within the above-described technical idea of the present invention, the data that can be stored in the data cells DC and the monitoring cells MTC may be extended to N-bit data (N is a natural number).

Further, although only examples in which the number of the monitoring cells MTC is 1, 2K and 3K have been described respectively in the above-described embodiments, as the data that can be stored in the data cells DC and the monitoring cells MTC may be extended to N-bit data, the number of the monitoring cells MTC may be extended to M (M=N*K, K is a natural number).

Figure 18:
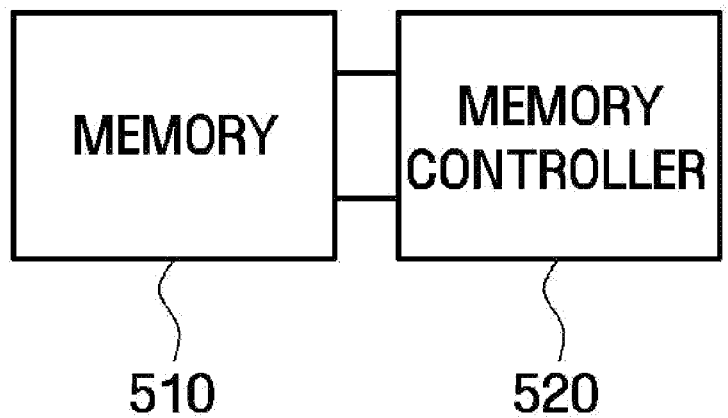
FIGS. 18 to 20 are diagrams for explaining an application example of the non-volatile memory device in accordance with the embodiments of the present invention.
Figure 19:
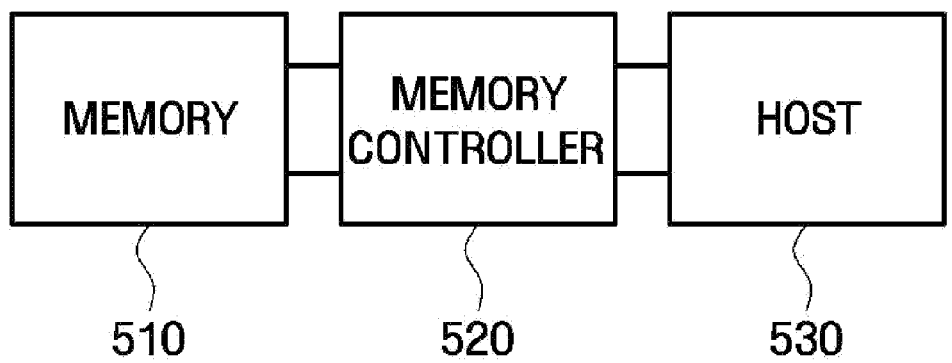
Figure 20:
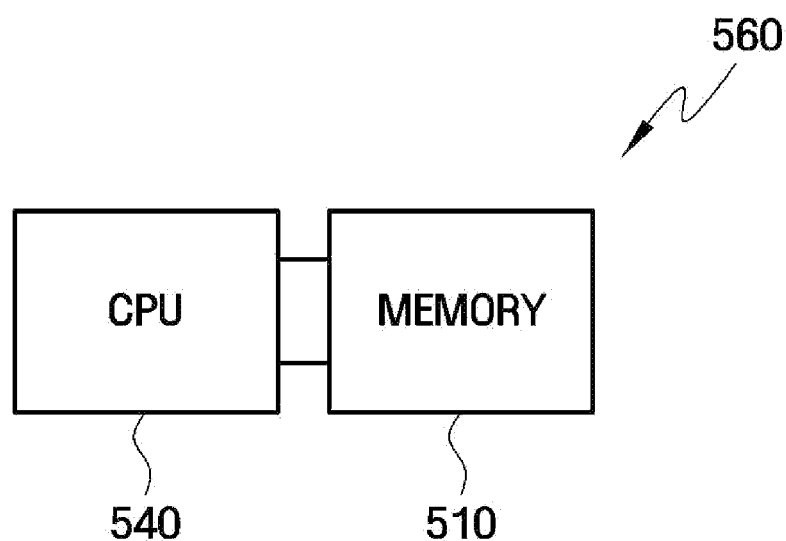

FIGS. 18 to 20 are diagrams for explaining an application example of the non-volatile memory device in accordance with the embodiments of the present invention.

Referring to FIG. 18, a system in accordance with the embodiment of the present invention includes a memory device 510 and a memory controller 520 connected to the memory device 510. In this case, memory device 510 may be a non-volatile memory device operating in accordance with the aforementioned embodiments of the present invention, which is a memory device capable of detecting whether sudden power off has occurred while programming data to memory cells without a reduction in performance of the device. Memory controller 520 may provide an input signal for controlling an operation of memory device 510, e.g., a command signal and an address signal for controlling a read operation and a write operation, to memory device 510.

The system including memory device 510 and memory controller 520 may be embodied in a card such as a memory card. Specifically, the system in accordance with the embodiment of the present invention may be embodied in a card which satisfies a specified industry standard and is used in an electronic device such as a mobile phone, a two-way communication system, a one-way pager, a two-way pager, a personal communication system, a portable computer, a personal data assistant (PDA), an audio and/or video player, a digital and/or video camera, a navigation system, a global positioning system (GPS), and the like. However, it is not limited thereto, and the system in accordance with the embodiment of the present invention may be embodied in various forms such as a memory stick.

Referring to FIG. 19, a non-volatile memory system in accordance with another embodiment of the present invention may include a memory device 510, a memory controller 520, and a host system 530. In this case, host system 530 may be connected to memory controller 520 via a bus and the like, and provide a control signal to memory controller 520, so that memory controller 520 can control an operation of memory device 510. Host system 530 may be, for example, a processing system used in a mobile phone, a two-way radio communication system, a one-way pager, a two-way pager, a personal communication system, a portable computer, a PDA, an audio and/or video player, a digital and/or video camera, a navigation system, a GPS, and the like.

Meanwhile, although memory controller 520 is interposed between memory device 510 and host system 530 in FIG. 19, it is not limited thereto, and the memory controller 520 may be selectively omitted in a system in accordance with still another embodiment of the present invention.

Referring to FIG. 20, a system in accordance with still another embodiment of the present invention may be a computer system 560 including a central processing unit (CPU) 540 and a memory device 510. In computer system 560, memory device 510 may be connected to CPU 540 directly or using a typical computer bus architecture. Memory device 510 may store an operation system (OS) instruction set, a basic input/output start up (BIOS) instruction set, an advanced configuration and power interface (ACPI) instruction set and the like, or may be used as a large-capacity storage device such as a solid state disk (SSD).

For convenience of explanation, all components included in computer system 560 are not illustrated in FIG. 20, but it is not limited thereto. Further, for convenience of explanation, memory controller 520 is omitted between memory device 510 and CPU 540 in FIG. 20. However, memory controller 520 may be interposed between memory device 510 and CPU 540 in still another embodiment of the present invention.

In concluding the detailed description, those skilled in the art will appreciate that many variations and modifications can be made to the preferred embodiments without substantially departing from the principles of the present invention. Therefore, the disclosed preferred embodiments of the invention are used in a generic and descriptive sense only and not for purposes of limitation.

What is claimed is:

1. A method for programming a non-volatile memory device, comprising:
   providing a non-volatile memory device including data cells capable of storing N-bit data (N is a natural number) and at least one monitoring cell capable of monitoring whether the N-bit data has been programmed into the data cells;
   performing a first programming operation for programming the data cells while inhibiting programming of the monitoring cell; and
   performing a second programming operation for programming the monitoring cell while inhibiting programming of the data cells,
   wherein the second programming operation is performed differently from the first programming operation.

2. The method of claim 1, wherein the first programming operation uses an incremental step pulse program (ISPP) for programming the N-bit data into the data cells.

3. The method of claim 2, wherein the second programming operation applies a single program pulse one time to the monitoring cell.

4. The method of claim 1, wherein the non-volatile memory device includes M monitoring cells (M=N*K, K is a natural number).

5. The method of claim 4, wherein N is 2, and wherein the 2-bit data includes LSB data and MSB data, and wherein:
   performing the first programming operation to program the data cells includes programming the LSB data into the data cells while inhibiting programming of the 2K monitoring cells, and performing the second programming to program the monitoring cell includes programming a first set of K monitoring cells among the 2K monitoring cells while inhibiting programming of the data cells to which the LSB data has been programmed.

6. The method of claim 5, wherein programming of a second set of K monitoring cells among the 2K monitoring cells is inhibited while performing the second programming to program the first set of K monitoring cells among the 2K monitoring cells.

7. The method of claim 5, further comprising:
programming the MSB data into the data cells while inhibiting programming of the 2K monitoring cells; and
performing the second programming operation for a second set of K monitoring cells while inhibiting programming of the data cells to which the MSB data has been programmed and the first set of K monitoring cells.

8. The method of claim 4, wherein N is 3, and wherein the 3-bit data includes LSB data, CSB data and MSB data, and wherein:
performing the first programming operation to program the data cells comprises programming the LSB data into the data cells while inhibiting programming of the 3K monitoring cells, and
performing the second programming operation to program the monitoring cell includes programming a first set of K monitoring cells among the 3K monitoring cells while inhibiting programming of the data cells to which the LSB data has been programmed.

9. The method of claim 8, wherein programming of a second set of K monitoring cells and a third set of K monitoring cells among the 3K monitoring cells is inhibited while performing the second programming operation to program the first set of K monitoring cells among the 3K monitoring cells.

10. The method of claim 1, further comprising reading the monitoring cell using a monitoring voltage to detect whether a sudden power off event has occurred while performing the first programming operation for programming the N-bit data into the data cells.

11. The method of claim 10, wherein the monitoring voltage is larger than a maximum value of a threshold voltage of the monitoring cell that can be changed by disturbance irrelevant to the second programming operation.

12. The method of claim 11, wherein the non-volatile memory device includes a plurality of monitoring cells, and
wherein the reading the monitoring cells using a monitoring voltage to detect whether the sudden power off event has occurred while performing the first programming operation for programming the data cells comprises reading the monitoring cells using the monitoring voltage, and if a threshold voltage of at least one of the monitoring cells is greater than or equal to than the monitoring voltage, determining that the sudden power off has not occurred during the first programming of the data cells.

13. The method of claim 1, wherein the data cells and the monitoring cell share a word line.

14. A method for programming a non-volatile memory device, comprising:
providing a non-volatile memory device including data cells capable of storing 3-bit data including first to third bit data and 3K (K is a natural number) monitoring cells capable of monitoring whether the 3-bit data has been programmed into the data cells;
programming the first bit data multiple times to the data cells while inhibiting programming of the 3K monitoring cells;
programming the first bit data once to a first set of K monitoring cells among the 3K monitoring cells while inhibiting programming of the data cells into which the first bit data has been programmed, and also inhibiting programming of a second set of K monitoring cells and a third set of K monitoring cells which are not included in the first set of K monitoring cells;
programming the second bit data multiple times to the data cells while inhibiting programming of the 3K monitoring cells;
programming the second bit data once to the second set of K monitoring cells while inhibiting programming of the data cells into which the second bit data has been programmed, and also inhibiting programming of the first set of K monitoring cells to which the first bit data has been programmed, and also a third set of K monitoring cells which are not included in the first and second sets of K monitoring cells.

15. The method of claim 14, further comprising:
programming the third bit data multiple times to the data cells while inhibiting programming of the 3K monitoring cells; and
programming the third bit data once to the third set of K monitoring cells while inhibiting programming of the data cells to which the third bit data has been programmed, and also inhibiting programming of the first and second sets of K monitoring cells.

16. A non-volatile memory device, comprising:
a word line;
a plurality of bit lines;
a set of data cells connected to the word line, each of the data cells further being connected to a corresponding one of the bit lines and each configured to store at least a first data bit; and
a monitoring cell connected to the word line and to a corresponding one of the bit lines, wherein the monitoring cell has a threshold voltage and is configured for the threshold voltage to have a first value whenever each of the set of data cells is programmed to store the first data bit without a power off event occurring while programming the first data into the set of data cells, and wherein the monitoring cell is configured for the threshold voltage to have a second value different from the first value whenever the power off event occurred while programming the first data bit into the set of data cells,
wherein programming of the monitoring cell is different from programming the first data bits into the set of data cells.

17. The non-volatile memory device of claim 16, wherein programming of the monitoring cell is inhibited while programming the first data bits into the set of data cells.

18. The non-volatile memory device of claim 16, wherein programming of the set of data cells is inhibited while programming the threshold voltage of the monitoring cell.

19. The non-volatile memory device of claim 16, wherein each of the set of data cells is further configured to store at least a second data bit, the non-volatile memory device further comprising a second monitoring cell connected to the word line, wherein the second monitoring cell has a threshold voltage and is configured for the threshold voltage to have a third value whenever each of the set of data cells is programmed to store the second data bit without a power off event occurring while programming the second data into the set of data cells, and wherein the second monitoring cell is configured for the threshold voltage to have a fourth value different from the third value whenever the power off event occurred while programming the second data bit into the set of data cells.

20. The non-volatile memory device of claim 19, wherein programming of the monitoring cell and the second monitoring cell is inhibited while programming the first data bits into the set of data cells, and also while programming the second data bits into the set of data cells.

* * * * *